(12) United States Patent
Jeon

(10) Patent No.: US 9,991,465 B2
(45) Date of Patent: Jun. 5, 2018

(54) DISPLAY DEVICE HAVING CRACK PREVENTION PORTION

(71) Applicant: SAMSUNG DISPLAY CO., LTD., Yongin-si, Gyeonggi-do (KR)

(72) Inventor: Hee Chul Jeon, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 71 days.

(21) Appl. No.: 14/937,766

(22) Filed: Nov. 10, 2015

(65) Prior Publication Data

US 2016/0315284 A1    Oct. 27, 2016

(30) Foreign Application Priority Data

Apr. 27, 2015  (KR) .................. 10-2015-0058892

(51) Int. Cl.
  *H01L 29/08*  (2006.01)
  *H01L 35/24*  (2006.01)
  *H01L 51/00*  (2006.01)
  *H01L 51/52*  (2006.01)
  *H01L 27/32*  (2006.01)

(52) U.S. Cl.
  CPC ........ *H01L 51/5246* (2013.01); *H01L 27/323* (2013.01)

(58) Field of Classification Search
  CPC ......... H01L 51/5253; H01L 2251/5338; H01L 27/3276; H01L 51/5246; H01L 51/56; H01L 27/323
  USPC ................ 257/40, 100; 438/23, 28; 345/174
  See application file for complete search history.

(56) References Cited

U.S. PATENT DOCUMENTS

| 2013/0207239 | A1  | 8/2013  | Yu et al. |
| 2014/0138637 | A1* | 5/2014  | Yang ................... H01L 27/1218 257/40 |
| 2015/0179728 | A1* | 6/2015  | Kwon ................. H01L 27/3276 257/40 |
| 2015/0255740 | A1* | 9/2015  | Nakada ............... H01L 51/0097 257/40 |
| 2016/0093827 | A1* | 3/2016  | Han ..................... H01L 51/5246 257/40 |
| 2016/0293884 | A1* | 10/2016 | Zhang ................ H05B 33/0896 |
| 2016/0306208 | A1* | 10/2016 | Hayashi ............ G02F 1/133528 |

FOREIGN PATENT DOCUMENTS

| JP | 5547901 B2 | 5/2014 |
| KR | 10-2014-0045836 A | 4/2014 |
| KR | 10-2014-0045838 A | 4/2014 |
| KR | 10-2014-0055950 A | 5/2014 |

* cited by examiner

*Primary Examiner* — Thao X Le
*Assistant Examiner* — Nduka Ojeh
(74) *Attorney, Agent, or Firm* — Lewis Roca Rothgerber Christie LLP

(57) ABSTRACT

A display device includes: a lower substrate comprising an active area, and a peripheral area outside the active area; a thin film transistor layer on the lower substrate; a plurality of pixel electrodes on the thin film transistor layer and in the active area; an encapsulating portion on the pixel electrode and encapsulating the pixel electrode; and a pattern layer comprising a plurality of patterns on the encapsulating portion, wherein the encapsulating portion covers a first area of the lower substrate and exposes a second area outside the first area, and the pattern layer comprises a crack preventing portion at the peripheral area.

15 Claims, 12 Drawing Sheets

DISPLAY DEVICE HAVING CRACK PREVENTION PORTION

CROSS-REFERENCE TO RELATED APPLICATION

This application claims priority to and the benefit of Korean Patent Application No. 10-2015-0058892, filed in the Korean Intellectual Property Office on Apr. 27, 2015, the entire content of which is incorporated herein by reference.

BACKGROUND

1. Field

Aspects of embodiments of the present invention relate to a display device.

2. Description of the Related Art

Display devices, such as a liquid crystal display (LCD), an organic light emitting diode display (OLED display), and an electrophoretic display, include a display panel in which an electro-optical active layer and a pixel electrode are formed. For example, the organic light emitting diode display includes an organic emission layer as the electro-optical active layer and the liquid crystal display includes an liquid crystal layer as the electro-optical active layer. The pixel electrode may be connected to a switching device such as a thin film transistor to receive a data signal, and the electro-optical active layer converts the data signal into an optical signal to display an image.

Among those, the organic light emitting diode display is a display device that uses an organic light emitting diode, which is a self light emitting device, to display an image. Therefore, the organic light emitting diode display does not require a separate light source and therefore is excellent in power consumption, response speed, viewing angle, and contrast ratio. Further, the organic light emitting diode display may be slimmed, may have excellent luminance and color purity, and may be applied to a flexible display device.

The organic light emitting diode display includes a pixel electrode, a counter electrode, and an emission layer positioned therebetween. One of the pixel electrode and the counter electrode is an anode and the other thereof is a cathode. The organic light emitting diode display combines electrons injected from the cathode with holes injected from the anode in the light emitting layer to form excitons and emits light while the excitons emits energy. The counter electrode is formed over a plurality of pixels and may be applied with a constant common voltage.

When impurities such as moisture and oxygen flow from the outside into the display device, the life of electric devices including the display device may be shortened and the organic light emitting diode display may have reduced emission efficiency of the emission layer. Further, a problem of a change in an emission color of the emission layer, etc., may occur.

Therefore, encapsulation processing to isolate the electric devices in the display device from the external environment at the time of manufacturing the display device to prevent impurities such as moisture from penetrating is performed. As the encapsulation processing method, there are a method for laminating a layer made of organic polymers such as polyester (PET) on an upper part of a lower substrate on which a thin film transistor, an emission layer, and the like are formed, a method for forming a cover or a cap with an encapsulating substrate and encapsulating edges of the lower substrate and the encapsulating substrate with a sealant, a method for forming an encapsulating portion including an encapsulating thin film layer formed by laminating a plurality of thin films instead of the encapsulating substrate, etc. A layer or a member that performs an encapsulating function is called an encapsulating portion.

The above information disclosed in this Background section is only for enhancement of understanding of the background of the invention and therefore it may contain information that does not constitute prior art.

SUMMARY

Aspects of embodiments of the present invention relate to a display device, and a display device capable of preventing or reducing instances of crack propagation.

An additional pattern or layer may be formed on the encapsulating portion of the display device. For example, when the display device includes a touch sensible function which may interact with a user besides a function of displaying an image, a pattern and/or a layer forming a touch sensor may be additionally formed on the encapsulating portion.

When an impact is applied to the display device from the outside, a crack may occur in an insulating layer or a pattern of the display panel.

The crack may mainly occur at edges or an outer layer of the display panel and thus may be propagated into the display panel, in which the crack propagated into the display panel may cause a defect of the internal electric devices such as the thin film transistor In particular, a display panel including a flexible substrate having flexibility has been mostly developed in recent years and the crack may more frequently occur in several layers of the display panel due to the flexibility.

According to aspects of some embodiments of the present invention, a display device may prevent or reduce instances of a crack occurring at an edge of the display panel or an upper layer of a peripheral area being propagated to protect internal electric devices of the display device from an effect of the crack.

According to some example embodiments of the present invention, a display device includes: a lower substrate including an active area, and a peripheral area outside the active area; a thin film transistor layer on the lower substrate; a plurality of pixel electrodes on the thin film transistor layer and in the active area; an encapsulating portion on the pixel electrode and encapsulating the pixel electrode; and a pattern layer including a plurality of patterns on the encapsulating portion, wherein the encapsulating portion covers a first area of the lower substrate and exposes a second area outside the first area, and the pattern layer includes a crack preventing portion at the peripheral area.

According to some embodiments, the crack preventing portion includes a plurality of portions spaced apart from each other.

According to some embodiments, the crack preventing portion includes a first part overlapping the encapsulating portion.

According to some embodiments, the crack preventing portion includes a second part not overlapping the encapsulating portion.

According to some embodiments, the plurality of patterns of the pattern layer include at least one insulating layer and at least one conductive layer.

According to some embodiments, the crack preventing portion includes at least one of the insulating layers of the plurality of patterns and/or at least one of the conductive layers of the plurality of patterns.

According to some embodiments, the at least one conductive layer includes a plurality of touch electrodes at the active area that are spaced apart from each other.

According to some embodiments, the plurality of touch electrodes include a first touch electrode on the encapsulating portion and a second touch electrode in a layer different from that of the first touch electrode.

According to some embodiments, the pattern layer includes a first insulating layer on the first touch electrode and a second insulating layer on the second touch electrode.

According to some embodiments, the pattern layer further includes a touch wiring connected to the touch electrode, and the touch wiring includes a part positioned in the peripheral area.

According to some embodiments, the touch wiring is at a first peripheral area of the peripheral area that is adjacent to the active area, and the crack preventing portion is at a second peripheral of the peripheral area outside the first peripheral area.

According to some embodiments, the crack preventing portion is spaced apart from the touch wiring.

According to some embodiments, the display device further includes a buffer layer between the encapsulating portion and the pattern layer.

According to some embodiments, the thin film transistor layer includes at least one insulating layer, and the at least one insulating layer of the thin film transistor layer includes an edge portion dummy pattern at the peripheral area and has at least one dam type.

According to some embodiments, the display device further includes a buffer layer between the encapsulating portion and the pattern layer, wherein the buffer layer covers the edge portion dummy pattern.

According to some embodiments, the encapsulating portion includes at least one inorganic layer and at least one organic layer, which are alternately laminated.

According to some embodiments, a light emitting element layer including the pixel electrode is between the thin film transistor layer and the encapsulating portion.

According to some example embodiments of the present invention, the internal electric devices of the display device may be protected from the effect of the crack by preventing or reducing instances of cracks occurring at the edges of the display panel or at the upper layer of the peripheral area being propagated, thereby reducing the occurrence of defects of the display device.

DETAILED DESCRIPTION

Figure 1A:
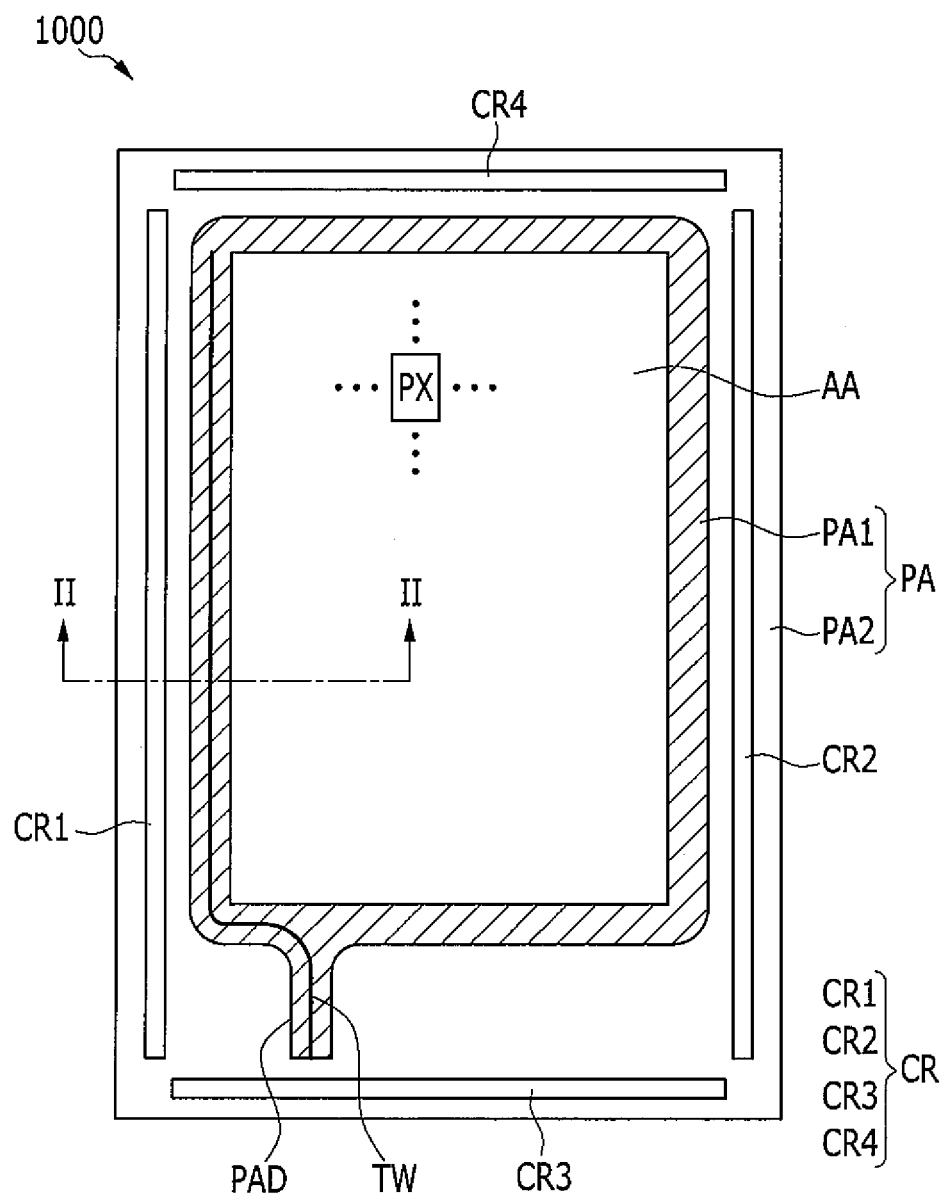
FIGS. 1A and 1B each are layout views of a display device according to an example embodiment of the present invention.

The present invention will be described more fully hereinafter with reference to the accompanying drawings, in which example embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Accordingly, the drawings and description are to be regarded as illustrative in nature and not restrictive. Like reference numerals designate like elements throughout the specification.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

Hereinafter, a display device according to an example embodiment of the present invention will be described in more detail with reference to the accompanying drawings.

First, a display device according to an example embodiment of the present invention will be described with reference to FIGS. 1A, 1B, and 2 to 5.

Figure 1B:
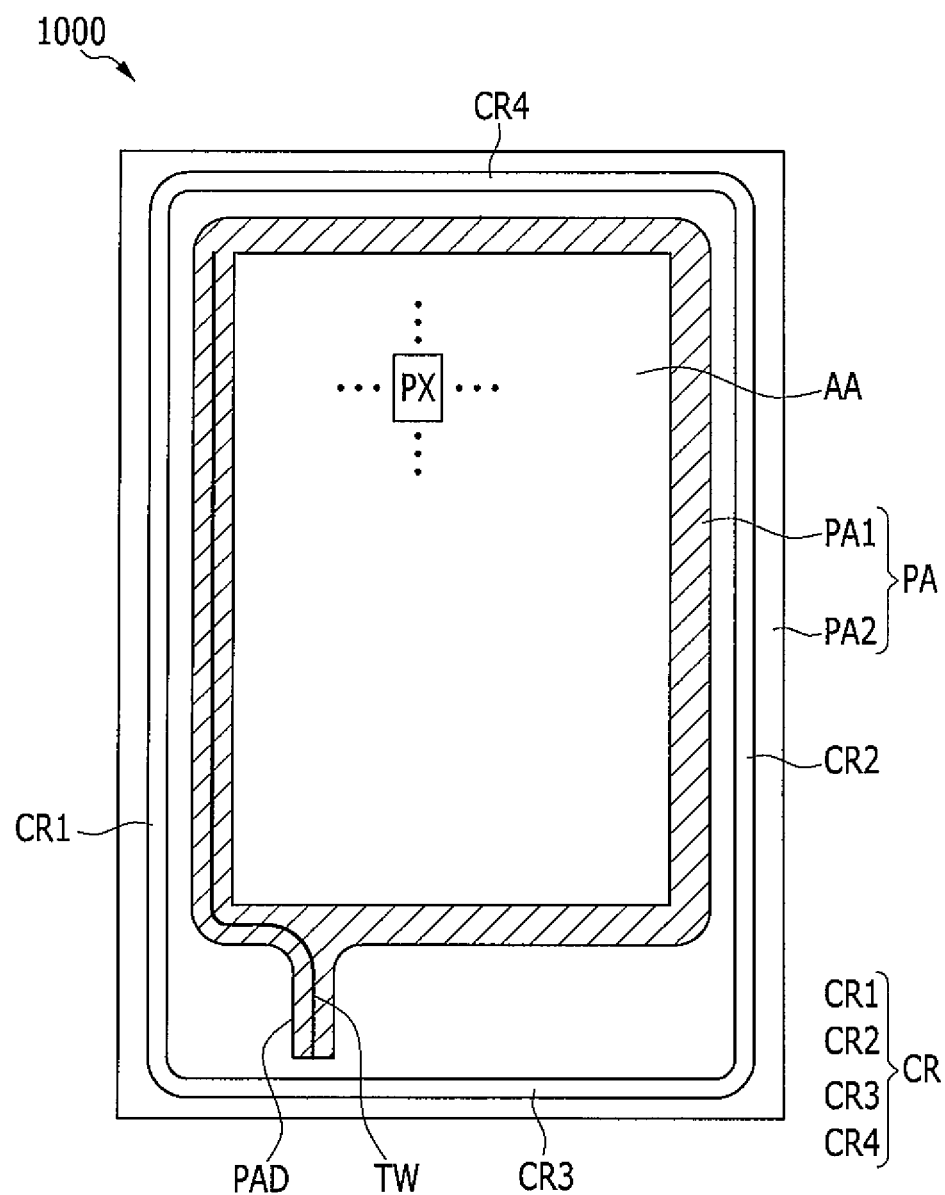

FIGS. 1A and 1B each are layout views of a display device according to an example embodiment of the present invention and FIGS. 2 to 5 each are cross-sectional views of the display device illustrated in FIG. 1A taken along the line II-II.

Referring first to FIGS. 1A and 1B, a display device according to an example embodiment of the present invention includes a display panel 1000.

When viewed in a plane structure, the display panel 1000 includes an active area AA and a peripheral area PA positioned outside (e.g., outside the periphery of) the active area AA.

A plurality of pixels PXs, which may display an image, and a plurality of display signal lines connected to the pixels PXs to transfer driving signals are positioned in the active area AA.

A display signal line includes a plurality of gate lines transferring gate signals and a plurality of data lines transferring data signals. The gate line and the data line may extend while intersecting with each other. The display signal line may extend to the peripheral area PA to form a pad portion. The pad portion of the display signal line may be positioned in the peripheral area PA under the display panel 1000 illustrated in FIGS. 1A and 1B.

The plurality of pixels PXs may be arranged in approximately a matrix form but is not limited thereto. Each pixel PX may include at least one switching element connected to the gate line and the data line and a pixel electrode connected thereto. The switching element may be three terminal elements such as a thin film transistor which is integrated in the display panel 1000. At least one switching element included in the pixel PX may be turned-on or turned-off depending on the gate signals, which the gate lines transfer to selectively transfer the data signals, which the data lines transfer to the pixel electrodes.

To implement a color display, each pixel PX may display one of primary colors and a desired color is recognized by a sum of these primary colors. For example, the primary colors may include three primary colors such as red, green, and blue or four primary colors.

According to the example embodiment of the present invention, at least a part of the active area AA may be a touch sensible area which is an area in which a touch may be sensed. In this case, the display device serves to sense a touch from the outside (e.g., from a user's finger or a stylus).

Here, the touch includes a case in which an external object like a user's hand directly contacts a touch surface of the display device as well as a case in which the external object approaches a surface of the display device or a case in which the external object hovers in the approached state. For example, most of the active area AA may form touch sensible area, a user touches icons, etc., and the display device may display the image depending on the touched result.

The peripheral area PA may be a touch inactive area in which most touch may not be sensed but is not limited thereto and at least a part of the peripheral area PA may form the touch sensible area. According to the example embodiment of the present invention, when the display device includes the touch sensible function, the case in which most of the active area AA is the touch sensible area and most of the peripheral area PA is the touch inactive area will be described by way of example.

A plurality of touch electrodes which form the touch sensor for sensing the touch and a plurality of touch wirings connected to the touch electrodes may be positioned in the active area AA.

The touch sensor may sense a touch by various methods. For example, the touch sensor may be classified into various types, such as a resistive type, a capacitive type, an electromagnetic type (EM), and an optical type. An example of a detailed structure of the touch sensor will be described below.

The peripheral area PA may include a first peripheral area PA1 adjacent to the active area AA and a second peripheral area PA2 positioned outside the active area AA.

The wiring connected to the active area AA may be positioned in the first peripheral area PA1. For example, when the display device has the touch sensible function, a plurality of touch wirings TWs, which are connected to the touch electrodes positioned in the active area AA, may be positioned in the first peripheral area PA1. The touch wiring TIN may extend along edges of the display panel 1000 in the first peripheral area PA1 and a pad portion PAD may be formed at one side (e.g., a lower portion of the peripheral area PA in FIG. 1A or 1B) of the peripheral area PA. The pad portion PAD of the touch wiring TW may be connected to a driver which transfers a signal for driving a touch sensor. The driver may be mounted in a form of at least one IC chip or mounted on a flexible printed circuit film (FPC), etc., to be attached to the pad portion (PAD) in a tape carrier package (TCP) or integrated in the display panel 1000.

The second peripheral area PA2 may be positioned outside the first peripheral area PA1 and enclose the first peripheral area PA1. At least one crack preventing portion CR is positioned in the second peripheral area PA2. The crack preventing portion CR may prevent a crack from being expanded and transferred to the active area AA when the crack occurs at the edges of the display panel 1000 or the upper layer (or outside layer) of the peripheral area PA due to the impact from the outside to the display panel 1000 during the manufacturing process or the use process of the display device. In particular, when the crack occurs in the same layer as the crack preventing portion CR, the crack preventing portion CR may prevent the crack from being transferred to the active area AA along the layer or the crack from being propagated to several electric devices such as the pixels PX and the display signal lines which are positioned inside the active area AA.

The crack preventing portion CR may include a plurality of crack preventing portions CR1, CR2, CR3, and CR4 which extend along different edges of the display panel 1000. Each of the crack preventing portions CR1, CR2, CR3, and CR4 may be adjacent to each edge of the display panel 1000. As illustrated in FIG. 1A, the crack preventing portions CR1, CR2, CR3, and CR4 are spaced apart from each other and as illustrated in FIG. 1B, at least two of the plurality of crack preventing portions CR1, CR2, CR3, and CR4 may be connected to each other. FIG. 1B illustrates an example in which the crack preventing portions CR1, CR2, CR3, and CR4 are connected to each other along the edges of the display panel 1000 to form approximately a closed curved line (e.g., with curved corners and straight edges).

The crack preventing portions CR which extend to be adjacent to one edge of the display panel 1000 are spaced apart from each other at an interval and each may include at least one part which forms a dam type. Each portion of the crack preventing portion CR is spaced apart from each other and may be an island type. Therefore, when the crack occurs at the edges of the display panel 1000 or the upper layer or the outer layer of the peripheral area PA, the transfer of the crack may be blocked.

FIGS. 1A and 1B illustrate an example in which the crack preventing portion CR is a straight form but is not limited thereto. For example, the continuously extending crack preventing portion CR may have a rias type in which protrusions and depressions are alternately formed in a plane.

Next, a sectional structure of the display panel 1000 will be described with reference to FIGS. 1A and 1B and FIG. 2.

Figure 2:
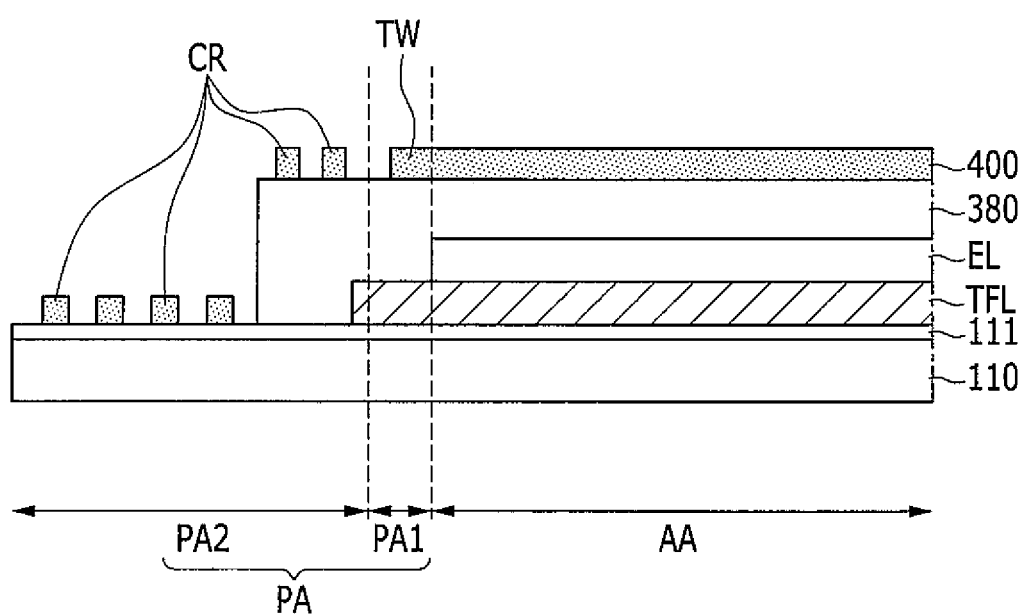
FIGS. 2 to 5 each are cross-sectional views of the display device illustrated in FIG. 1A taken along the line II-II.

Referring to FIG. 2, the display panel 1000 includes a lower substrate 110. The lower substrate 110 may include glass, plastic, or the like. The lower substrate 100 may have flexibility. In this case, the lower substrate 110 may include various plastic such as polyethyleneterephthalate (PET), polyethylenenaphthalate (PEN), polycarbonate (PC), polyarylate (PAR), polyetherimide (PEI), polyethersulfone (PES), or polyimide (PI), a metal thin film, an ultra-thin glass, or the like.

A barrier layer 111 is positioned on the lower substrate 110. The barrier layer 111 may prevent impurities from the outside from penetrating into the upper part through the lower substrate 110. The barrier layer 111 may include at least one of an inorganic layer and an organic layer. For example, the barrier layer 111 may include silicon nitride (SiNx), silicon oxide (SiOx), silicon oxynitride (SiOxNy), or the like. The barrier layer 111 may also be omitted.

A thin film transistor layer (TFL) is positioned on the barrier layer 111.

The thin film transistor layer (TFL) may include, for example, a semiconductor layer, a gate insulating layer positioned thereon, a plurality of gate conductors positioned thereon, a first passivation layer positioned thereon, a plurality of data conductors positioned thereon, a second passivation layer positioned thereon, etc. The gate conductor may include at least one gate electrode that overlaps a channel region of the semiconductor layer. The first and second passivation layers and the gate insulating layer may made of an inorganic insulating material or/and an organic insulating material. The data conductor may include a plurality of data lines through which the data signals are transferred and an input electrode and an output electrode which are connected to source and drain areas of the semiconductor layer. Some of the input electrodes may be connected to the data lines. The gate electrode, the input electrode, and the output electrode may form the thin film transistor together with the semiconductor.

The thin film transistor layer (TFL) may be positioned the active area and the first peripheral area PA1 and may also be positioned in the second peripheral area PA2 in a plane.

A light emitting element layer may be positioned on the thin film transistor layer TFL.

The light emitting element layer (EL) may include a plurality of pixel electrodes that are positioned on a second passivation layer, a pixel defined layer having a plurality of openings through which the pixel electrodes are exposed, an emission member which is positioned on the pixel electrode, a counter electrode which is positioned on the emission member, etc. The pixel electrode may be physically and electrically connected to an output electrode of the thin film transistor through a contact hole of the second passivation layer.

The pixel electrodes, the emission members, and the counter electrodes that are positioned in each pixel PX may form a light emitting device.

Most of the light emitting element layer (EL) may be positioned in the active area AA in a plane.

An encapsulating portion 380 is positioned on the light emitting element layer (EL)

The encapsulating portion 380 may encapsulate the light emitting element layer (EL) to prevent or reduce instances of moisture and/or oxygen penetrating from the outside.

The encapsulating portion 380 may include at least one of the inorganic layer and the organic layer, in which the organic layer and the inorganic layer may be alternately laminated. An upper surface of the encapsulating portion 380 may be planarized. The encapsulating portion 380 may cover only a part of the lower substrate 110 and expose the rest portion. That is, the encapsulating portion 380 may cover the active area AA and only a part of the peripheral area PA therearound.

The encapsulating portion 380 is not limited to the example embodiment of the present invention and may also have various structures such as an organic polymer layer of polyester (PET) formed on the light emitting element layer (EL) by laminating, the encapsulating substrate which is sealed, etc.

A pattern layer 400 including the crack preventing portion (CR) is positioned on the encapsulating portion 380.

The pattern layer 400 may further include, for example, a pattern of a touch sensor which may sense a touch from the outside. The pattern of the touch sensor may include the touch electrode and the touch wiring TW connected thereto. Most of the touch electrode may be positioned in the active area AA but is not limited thereto, but may be positioned in the first peripheral area PA1. The touch wiring TW may be mainly positioned in the first peripheral area PA1 and may also include a part that is positioned in the active area AA.

The pattern layer 400 may include a plurality of layers that include at least one insulating layer and at least one conductive layer.

The crack preventing portion CR includes at least one of the plurality of layers which are included in the pattern layer 400 and is spaced apart from the pattern of the pattern layer 400 positioned in the first peripheral area PA1 and may form at least one dam type.

The crack preventing portion CR may include a part that forms at least one dam type positioned on the encapsulating portion 380. The crack preventing portion CR, which is positioned on the encapsulating portion 380, is spaced apart from the touch wiring TW, which is formed on the same layer. The crack preventing portion CR, which is positioned on the encapsulating portion 380, may be mainly positioned in the second peripheral area PA2.

The crack preventing portion CR is positioned in the second peripheral area PA2 and is positioned on a part which does not overlap the encapsulating portion 380, that is, a part in which the encapsulating portion 380 is not formed and may include a part forming at least one dam type. The crack preventing portion CR, which is not positioned on the encapsulating portion 380, may be positioned in the peripheral area PA outside the edge of the encapsulating portion 380 in a plane and may be positioned on the barrier layer 111. The crack preventing portion CR, which does not Overlap the encapsulating portion 380, is positioned at a layer that is formed later than the thin film transistor layer (TFL) and the light emitting element layer (EL).

The crack preventing portion CR may include at least one part which is spaced apart from each other and each forms a dam type and each portion may extend along the edge of the display panel 1000 as described above.

The pattern layer 400 including the crack preventing portion CR may be directly formed on the upper surface of the display panel 1000, that is, the upper surface of the encapsulating portion 380 and the barrier layer 111. If the crack preventing portion CR is formed before the encapsulating portion 380 is laminated, there may be a problem in the adhesion of the encapsulating portion 380, and therefore the structure for preventing a crack may be at a predetermined interval from the edges of the encapsulating portion 380. However, the crack preventing portion CR according to the example embodiment of the present invention is formed after the encapsulating portion 380 is formed and therefore no problem in adhesion of the encapsulating portion 380 occurs. Therefore, an area in which the crack preventing portion CR may be formed is wide and further may also be formed on the encapsulating portion 380. Therefore, when the impact is applied to the display panel 1000 from the outside, the crack occurring from the edge of the display panel 1000 or the upper layer of the peripheral area (PA) may be efficiently prevented from being propagated toward the active area AA and the internal devices of the active area AA.

In particular, the crack preventing portion CR is positioned on the same layer as the pattern layer 400, which is positioned on the encapsulating portion 380, and therefore even though the crack occurs in the pattern layer 400, which is a layer positioned at a more outer side than the encapsulating portion 380, it may be possible to prevent or reduce instances of cracks being propagated to the active region AA.

Figure 3:
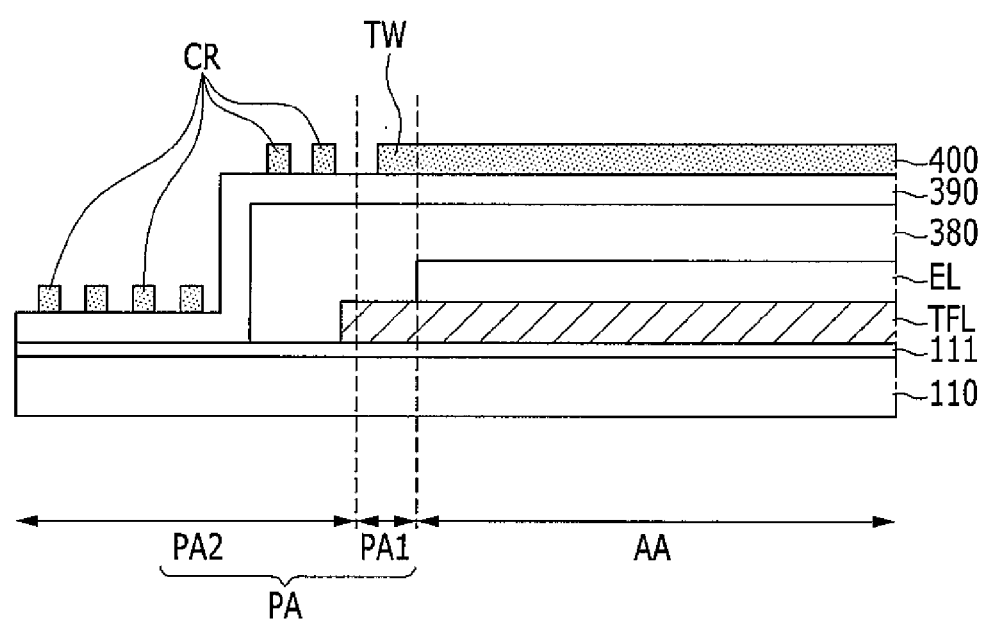

Referring to FIG. 3, the display device according to the example embodiment of the present invention is almost the same as the display device illustrated in FIGS. 1A, 1B, and 2 but the buffer layer 390 may be further positioned on the barrier layer 111 and the encapsulating portion 380 and beneath the pattern layer 400. The buffer layer 390 may include inorganic insulating materials such as silicon nitride (SiNx) and silicon oxide (SiOx).

The crack preventing portions CR are positioned on the buffer layer 390.

Figure 4:
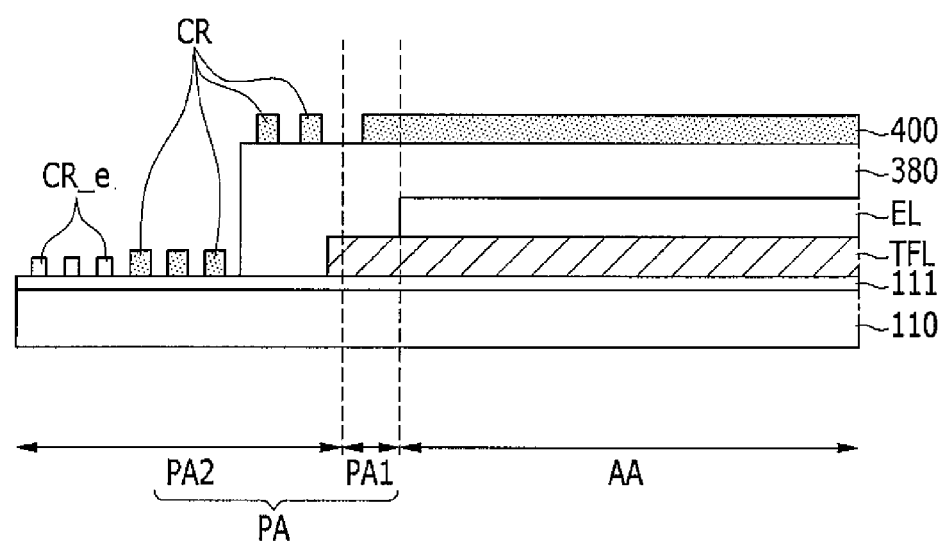

Referring to FIG. 4, the display device according to the example embodiment of the present invention is almost the same as the display device according to the example embodiment of the present invention illustrated in FIGS. 1A, 1B, and 2 but may further include an edge portion dummy pattern CR_e. The edge portion dummy pattern CR_e is positioned in the second peripheral area PA2 and may be positioned in an area between the crack preventing portion CR according to the example embodiment of the present invention and the edge of the display panel 1000.

The edge portion dummy pattern CR_e may be positioned on the same layer as at least one insulating layer which is included in the thin film transistor layer (TFL)

For example, the edge portion dummy pattern CR_e may be positioned on the same layer as the insulating layer including the inorganic insulating material.

The edge portion dummy pattern CR_e may also include a part which is positioned on the same layer as the barrier layer 111.

The edge portion dummy pattern CR_E may be formed in at least one dam configuration. The edge portion dummy pattern CR_e may serve to prevent or reduce instances of cracks occurring at the edges of the display panel 1000 due to the impact applied during the manufacturing process of the display device such as the cell cutting from being propagated to the active area AA.

Referring to FIG. 4, the edge portion dummy pattern CR_e includes at least one portion that is spaced from each other to more efficiently block the crack from being propagated. In particular, the crack occurring on the same layer as the edge portion dummy pattern CR_e may be blocked by the spaced space to prevent the crack from being propagated to the active area AA.

Figure 5:
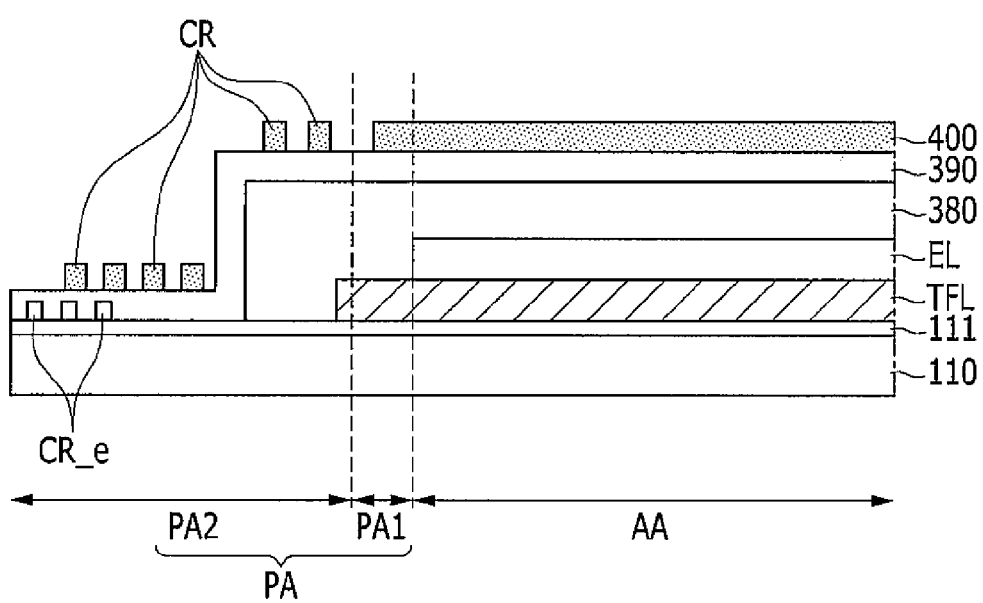

Referring to FIG. 5, the display device according to the example embodiment of the present invention is almost the same as the display device according to the example embodiment of the present invention illustrated in FIG. 4 as described above, but the buffer layer 390 may be further positioned on the edge portion dummy pattern CR_e and the encapsulating portion 380 and beneath the pattern layer 400. The buffer layer 390 covers the edge portion dummy pattern CR_e and the crack preventing portion CR is positioned on the buffer layer 390. The buffer layer 390 may include inorganic insulating materials such as silicon nitride (SiNx) and silicon oxide (SiOx).

As illustrated in FIG. 5, the edge portion dummy pattern CR_e may overlap at least a part of the crack preventing portion CR. Unlike this, the edge portion dummy pattern CR_e may not overlap the crack preventing portion CR.

The example embodiment of the present invention describes an example in which the organic light emitting diode display is a display device, but the display device according to the example embodiment of the present invention is not limited thereto and therefore may be various display devices such as the liquid crystal display. In this case, the structure of the thin film transistor layer (TFL) and the light emitting element layer (EL) may each be differently configured to meet each display device.

Next, one example of the pattern layer 400 included in the display device according to the example embodiment of the present invention will be described with reference to FIGS. 6 and 7 along with the drawings described above.

Figure 6:
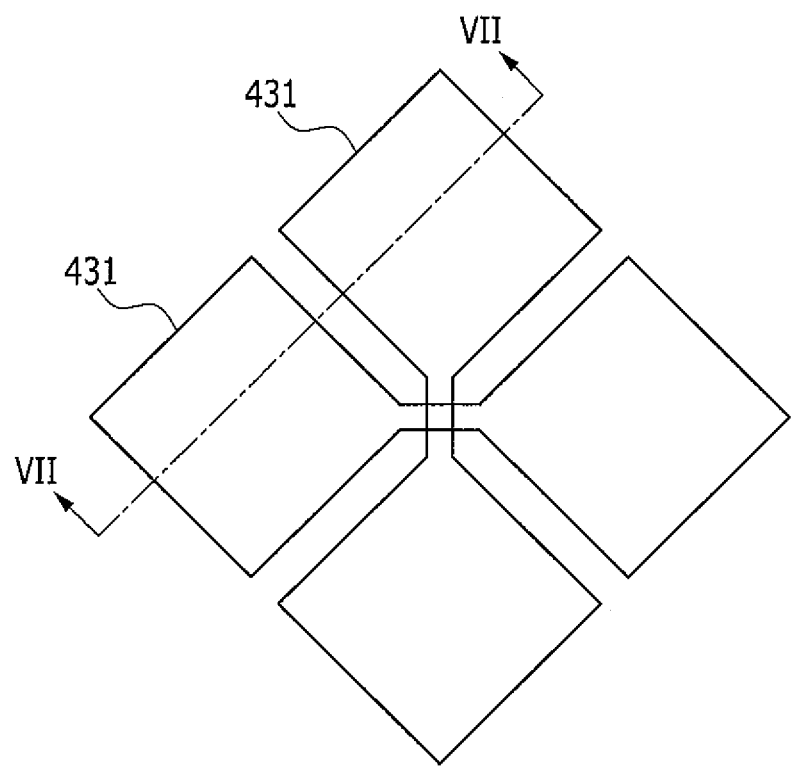
FIG. 6 is a plan view illustrating a part of a touch sensor including the display device according to the example embodiment of the present invention.
Figure 7:
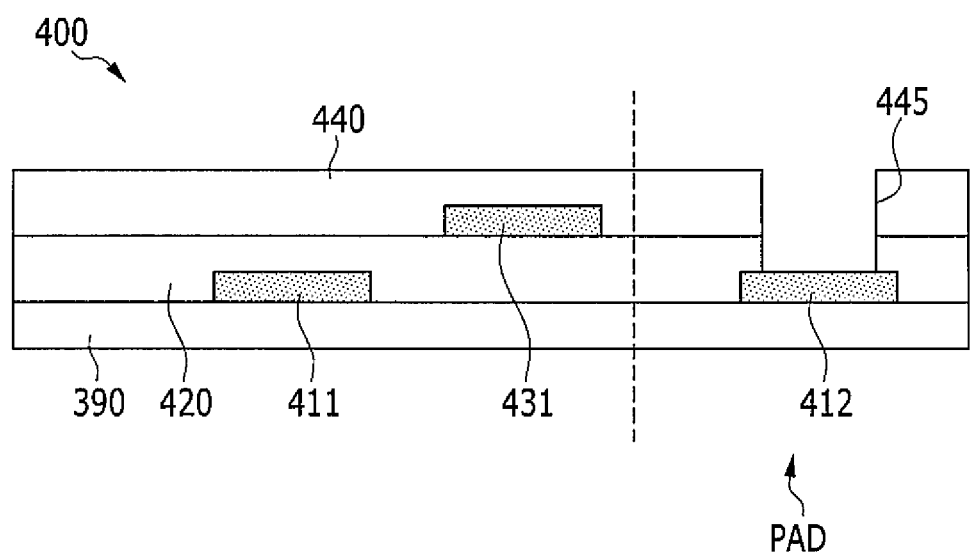
FIG. 7 is a cross-sectional view of the touch sensor illustrated in FIG. 6 taken along the line VII-VII.

FIG. 6 is a plan view illustrating a part of a touch sensor including the display device according to the example embodiment of the present invention and FIG. 7 is a cross-sectional view of the touch sensor illustrated in FIG. 6 taken along the line VII-VII.

The pattern layer 400 according to the example embodiment of the present invention includes a plurality of first touch electrodes 411, a plurality of second touch electrodes 431, and at least one insulating layer 420 and 440, which configure the touch sensor.

The plurality of first touch electrodes 310 and the plurality of second touch electrodes 431 are alternately arranged in the active area AA. For example, the plurality of first touch electrodes 411 may be arranged in plural along a column direction and a row direction, respectively, and the plurality of second touch electrodes 431 are arranged in plural along a column direction and a row direction, respectively.

The plurality of first touch electrodes 411 arranged in the same row or column may be connected to or spaced apart from each other inside or outside the active area AA. Likewise, at least some of the plurality of second touch electrodes 431 arranged in the same row or column may also be connected to or spaced apart from each other inside or outside the active area AA. FIG. 6 illustrates an example in which the plurality of first touch electrodes that are positioned in the same row are connected to each other in the active area AA and the plurality of second touch electrodes 431 that are positioned in the same column are connected to each other in the active area AA.

Referring to FIG. 7, the first touch electrode 411 and the second touch electrode 431 may be positioned on different layers.

For example, when the display device includes the buffer layer 390 described above, the first touch electrode 411 may be positioned on the buffer layer 390.

The first insulating layer 420 may be positioned on the first touch electrode 411 and the second touch electrode 431 may be positioned thereon. The first insulating layer 420 may be made of the inorganic insulating materials, such as silicon nitride (SiNx) and silicon oxide (SiOx) or the organic insulating material.

A first touch wiring 412 connected to the first touch electrode 411 and a second touch wiring connected to the second touch electrode 431 may be positioned on the buffer layer 390. The first touch wiring 412 and the second touch wiring may form the pad portion PAD in the peripheral area PA.

The second insulating layer 440 is positioned on the second touch electrode 431 and the first and second touch wirings 412. The second insulating layer 440 may be made of the inorganic insulating materials, such as silicon nitride (SiNx) and silicon oxide (SiOx) or the organic insulating material.

The first insulating layer 420 and/or the second insulating layer 440 may include a contact hole 445 through which the pad portion PAD of the first touch wiring 412 or the pad portion PAD of the second touch wiring is exposed.

The first touch electrode 411 and the second touch electrode 431 may have predetermined transmittance or more to transmit light. For example, the first touch electrode 411 and the second touch electrode 431 may be made of a thin metal layer of indium tin oxide (ITO), indium zinc oxide (IZO), silver nano wire (AgNw), and the like and may be made of a transparent conductive material of metal mesh, carbon nanotube (CNT), and the like, but is not limited thereto. When the first and second touch electrodes 411 and 431 include metal, they may include at least one conductive layer including, for example, titanium (Ti) and a multilayer including titanium (Ti). When the first and second touch electrodes 411 and 431 include the multilayer, they may be made of, for example, Ti/A/Ti.

The first touch wiring 412 and the second touch wiring may include low resistance materials such as molybdenum (Mo), silver (Ag), titanium (Ti), copper (Cu), aluminum (Al), and molybdenum/aluminum/molybdenum (Mo/Al/Mo), and may further include the same layer as the first touch electrode 411 or the second touch electrode 431.

The first and second touch electrodes 411 and 431 adjacent to each other form a mutual sensing capacitor serving as the touch sensor. The mutual sensing capacitor may receive the sensing input signal through one of the first and second touch electrodes 411 and 431 and output a change in a quantity of electrical charge due to a contact of an external object as a sensing output signal through the other touch electrodes.

According to another example embodiment of the present invention, the plurality of first touch electrodes 411 and the plurality of second touch electrodes 431 may be spaced apart from each other and each of them may be connected to the driver through the touch wiring. In this case, the respective touch electrodes may form self-sensing capacitors as the touch sensor. The self-sensing capacitor may receive the sensing input signal to be charged with a predetermined quantity of electrical charge, and the self-sensing capacitor may change the quantity of charged electric charge when the contact of the external objects such as a finger is present, thereby outputting the sensing output signal different from the received sensing input signal.

According to another example embodiment of the present invention, the first touch electrode 411 and the second touch electrode 431 may also be positioned on the same layer. In this case, the first touch electrodes 411 or the second touch electrodes 431 adjacent to each other may be connected to each other through conductive connecting legs that are insulated while being positioned in a layer different from the first and second touch electrodes 411 and 413.

The first and second touch electrodes 411 and 431 and the first and second insulating layers 420 and 440 form the pattern layer 400 together.

The crack preventing portion CR included in the display device according to the example embodiment of the present invention may include at least one of several layers of the pattern layer forming the touch sensor.

The structure of several layer of the crack preventing portion CR will be described with reference to FIGS. 8 to 10 along with the drawings as described above.

Figure 8:
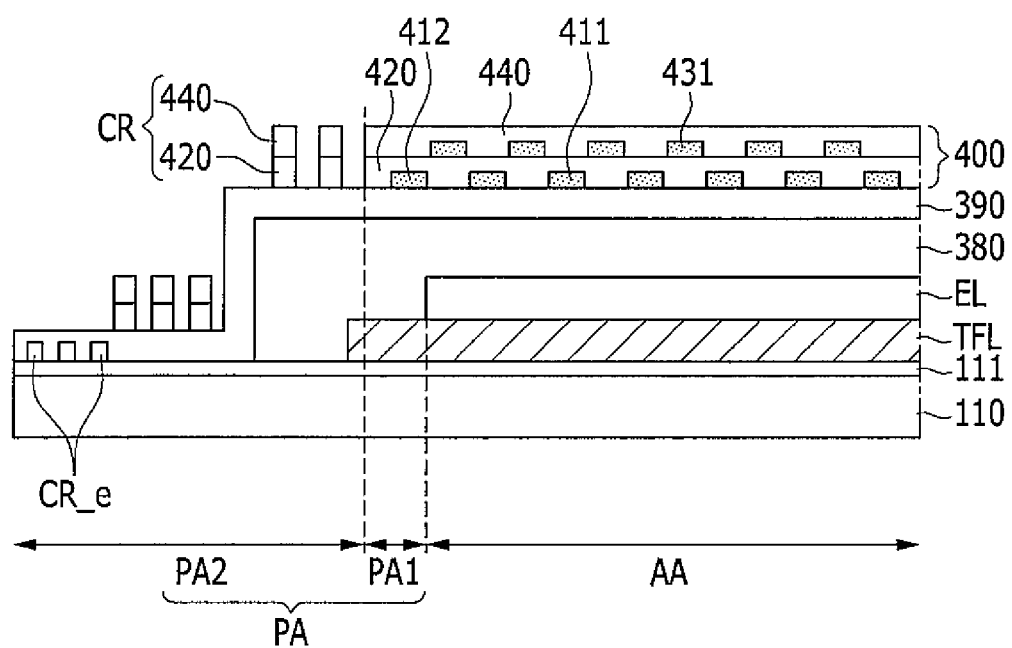
FIGS. 8 to 10 each are cross-sectional views of the display device illustrated in FIG. 1 taken along the line II-II.
Figure 9:
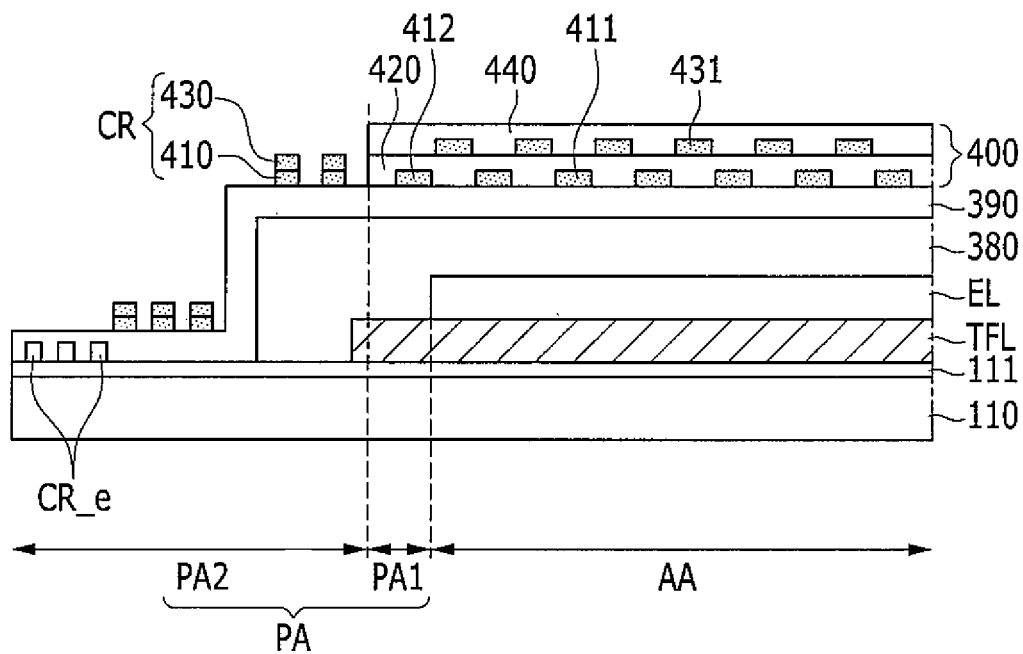
Figure 10:
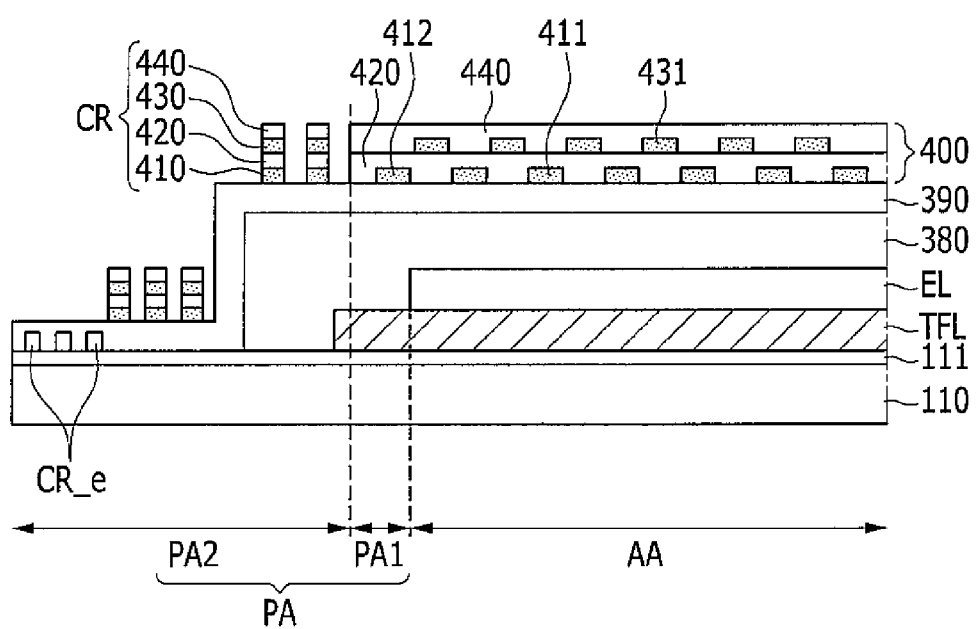

FIGS. 8 to 10 each are cross-sectional views of the display device illustrated in FIG. 1A taken the along line II-II.

Referring first to FIG. 8, the display device according to the example embodiment of the present invention is almost the same as the display device according to several example embodiments of the present invention described above. The display device according to the example embodiment of the present invention includes include the edge portion dummy pattern CR_e, which is positioned in the second peripheral area PA2, and is positioned in the area between the crack preventing portion CR and the edge of the display panel 1000 and the buffer layer 390, which is positioned on the edge portion dummy pattern CR_e.

The crack preventing portion CR, which is positioned on the buffer layer 390, may include at least one of the insulating layers which are included in the pattern layer 400 according to the example embodiment of the present invention described above. FIG. 8 illustrates an example in which the crack preventing portion CR includes the first insulating layer 420 and the second insulating layer 440.

According to the example embodiment of the present invention, when the crack occurs in the edges of the display panel, the upper layer of the peripheral area PA, in more detail, in the first insulating layer 420 and/or the second insulating layer 440 of the pattern layer 400 due to the external impact, the crack may be prevented from being propagated to the active area AA or the thin film transistor layer (TFL) or the light emitting element layer (EL) therein.

Referring to FIG. 9, the display device according to the example embodiment of the present invention is almost the same as the display device according to the example embodiment of the present invention illustrated in FIG. 8 described above, but the crack preventing portion CR may include at least one of the conductive layers included in the pattern layer 400 according to the example embodiment of the present invention described above. FIG. 9 illustrates an example in which the crack preventing portion CR includes the same conductive layers 410 and 430 as the first touch electrode 411 and the second touch electrode 431. The conductive layer 410 may be the same layer as the first touch electrode 411 and the conductive layer 430 may be the same layer as the second touch electrode 431.

The crack preventing portion CR may be patterned simultaneously with lamination of the same material in the same process as the first and second touch electrodes 411 and 431.

According to the example embodiment of the present invention, when the crack occurs in the edges of the display panel, the upper layer of the peripheral area PA, in more detail, in the first and second touch electrodes 411 and 431 of the pattern layer 400 due to the external impact, the crack may be prevented from being propagated to the active area AA or the thin film transistor layer (TFL) or the light emitting element layer (EL) therein.

Referring to FIG. 10, the display device according to the example embodiment of the present invention is almost the same as the display device according to the example embodiment of the present invention illustrated in FIGS. 8 and 9 described above, but the crack preventing portion CR may include the insulating layer and the conductive layer which are included in the pattern layer 400 according to the example embodiment of the present invention described above. FIG. 10 illustrates an example in which the crack preventing portion CR includes the first and second insulating layers 420 and 440 and the same conductive layers 410 and 430 as the first and second touch electrodes 411 and 431. The conductive layer 410 may be the same layer as the first touch electrode 411 and the conductive layer 430 may be the same layer as the second touch electrode 431. The crack preventing portions CR may be laminated and patterned together at the time of laminating and patterning the pattern layer 400

According to the example embodiment of the present invention, when the crack occurs in the edges of the display panel, the upper layer of the peripheral area PA, in more detail, in any layer of the pattern layer 400 due to the external impact, the crack may be prevented from being propagated to the active area AA or the thin film transistor layer (TFL) or the light emitting element layer (EL) therein.

Next, the structure of the display device according to the example embodiment of the present invention will be described in more detail with reference to FIG. 11, along with the above-mentioned drawings. The same constituent elements as the above-mentioned example embodiment of the present invention are denoted by the same reference numerals and the description thereof will be omitted.

Figure 11:
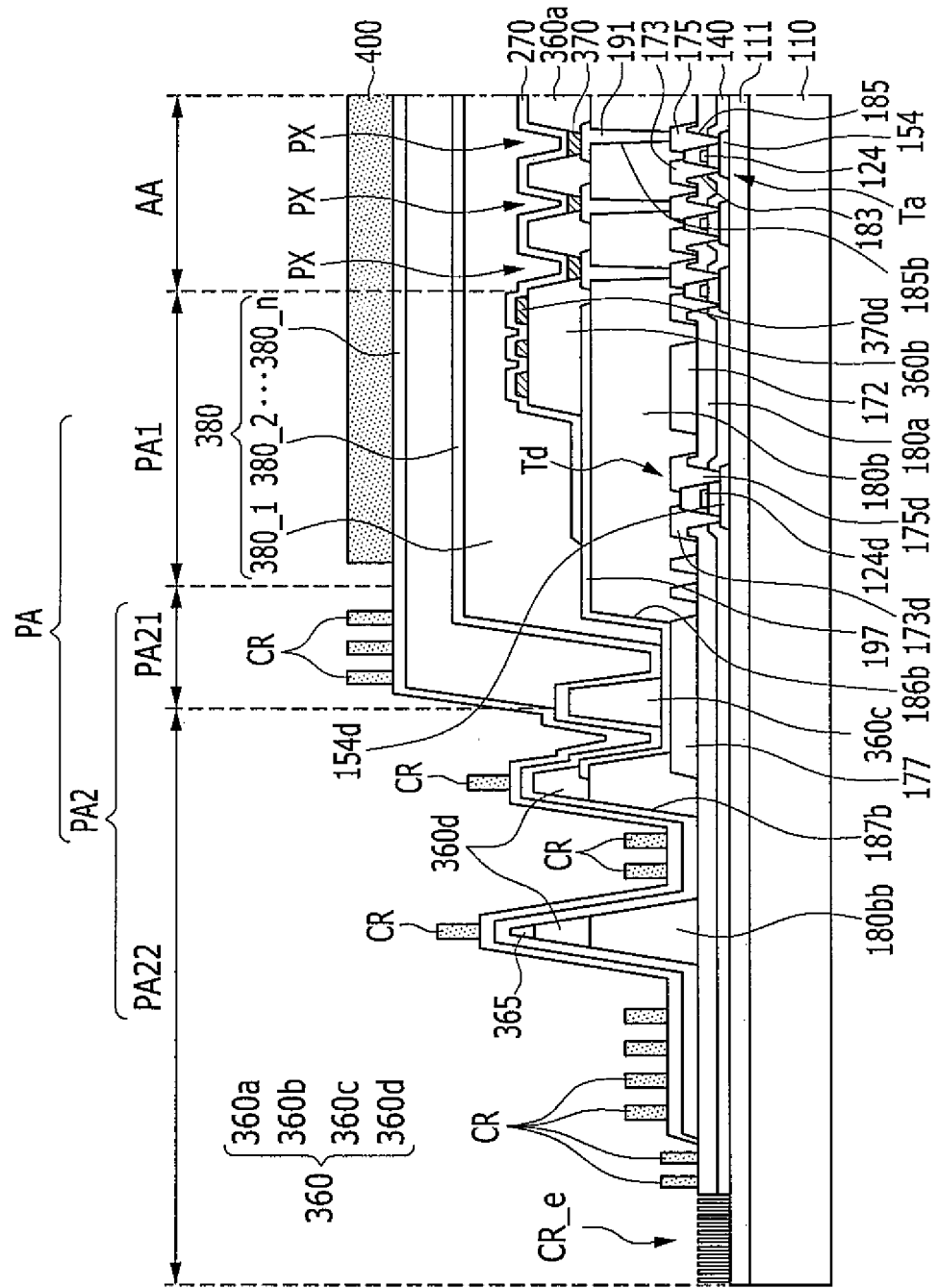
FIG. 11 is a cross-sectional view of the display device according to the example embodiment of the present invention.

FIG. 11 is a cross-sectional view of the display device according to the example embodiment of the present invention.

The display device according to the example embodiment of the present invention may include the lower substrate 110 and the barrier layer 111 positioned thereon.

At least one semiconductor layer is positioned on the barrier layer 111.

The semiconductor layer may include a semiconductor 154 which is positioned in the active area AA and at least one semiconductor 154d which is positioned in the first peripheral area PA1. The semiconductor 154 and 154d may each include a source region, a drain region, and a channel region positioned therebetween.

The semiconductor layer may include amorphous silicon, polycrystallinesilicon, oxide semiconductor, or the like.

A gate insulating layer 140 which may be made of silicon nitride (SiNx), silicon oxide (SiO$_2$), or the like is positioned on the semiconductor layer.

A plurality of gate conductors are positioned on the gate insulating layer 140. The gate conductor includes a control electrode 124 which is positioned in the active area AA. The control electrode 124 may overlap a part of the semiconductor 154, in particular, the channel region. The gate conductor may further include at least one control electrode 124d which is positioned in the first peripheral area PA1. The control electrode 124d may include a part which overlaps the channel region of the semiconductor 154d.

A first passivation layer 180a is positioned on the gate insulating layer 140 and the gate conductor. The first passivation layer 180a and the gate insulating layer 140 may include a contact hole 183 through which the source region of the semiconductor 154 is exposed and a contact hole 185 through which the drain region is exposed, in the active region AA. The first passivation layer 180a and the gate insulating layer 140 may include the contact hole through which the source region and the drain region of the semiconductor 154d are each exposed in the first peripheral area PA1.

The edge portion dummy pattern CR_e formed by removing a part of the gate insulating layer 140 and/or the first passivation layer 180a may be positioned in the second peripheral area PA2. The edge portion dummy patterns CR_e may include at least one portion that is spaced apart from each other and each forms the dam configuration. Each portion of the edge portion dummy pattern CR_e may extend along the edges of the display panel. The edge portion dummy patterns CR_e may be formed together by being patterned at the time of the forming of the contact holes 183 and 185 after the gate insulating layer 140 and/or the first passivation layer 180a are laminated. The edge portion dummy pattern CR_e may also be omitted.

The plurality of data conductors are positioned on the first passivation layer 180a.

The data conductor may include a plurality of data lines, a driving voltage line 172, a plurality of input electrodes 173 and 173d, a plurality of output electrodes 175 and 175d, a voltage transfer line 177, and the like.

The input electrode 173 and the output electrode 175 face each other on each semiconductor 154 and the input electrode 173d and the output electrode 175d face each other on each semiconductor 154d. The input electrode 173 and the output electrode 175 each may be electrically and physically connected to the source region and the drain region of the semiconductor 154 through each of the contact holes 183 and 185 and the input electrode 173d and the output electrode 175d each may be electrically and physically connected to the source region and the drain region of the semiconductor 154d through the contact holes of the gate insulating layer and the first passivation layer 180a.

The data line may transfer the data signal, a driving voltage line 172 may transfer a driving voltage, and a voltage transfer line 177 may transfer the same constant voltage as a common voltage ELVSS.

The voltage transfer line 177 may be positioned in the second peripheral area PA2.

The control electrode 124, the input electrode 173, and the output electrode 175 form a thin film transistor Ta included in the pixel PX together with the semiconductor 154. The control electrode 124d, the input electrode 173d, the output electrode 176d, and the semiconductor 154d all may form a driving thin film transistor Td which is positioned in the peripheral area PA. The driving thin film transistor Td may be included in a driving circuit which is integrated in the peripheral area PA. The driving circuit may be a gate driver which outputs a gate signal to a gate line which is positioned, for example in the active area AA.

A second passivation layer 180b including the inorganic insulating material and/or organic insulating material is positioned on the data conductor. The second passivation layer 180b may have substantially a flat surface to increase emission efficiency of the organic light emitting diode display which will be formed thereon.

The second passivation layer 180b may have a contact hole 185b, through which the output electrode 175 is exposed, in the active area AA. The second passivation layer 180b includes a contact hole 186b through which the voltage transfer line 177 is positioned in the peripheral area PA.

The second passivation layer 180b may include an edge side 187b that is positioned in the peripheral area PA. The second passivation layer 180b may include at least one outside passivation layer 180bb that is positioned at an outer side of the edge side 187*b*. The outside passivation layer 180*bb* may extend along the peripheral of the edge side 187*b* of the second passivation layer 180*b*. The outer passivation layer 180*bb* may be positioned in the second peripheral area PA2.

A pixel electrode layer is positioned on the second passivation layer 180*b*.

The pixel electrode layer includes pixel electrodes 191 that are positioned in each pixel PX of the active area AA. The pixel electrode 191 is physically and electrically connected to the output electrode through the contact hole 185*b* of the second passivation layer 180*b*.

The pixel electrode layer may further include a voltage transfer electrode 197 which is positioned in the peripheral area PA. The voltage transfer electrode 197 may be physically and electrically connected to the voltage transfer line 177 through the contact hole 186*b* to be applied with the common voltage ELVSS.

The pixel electrode layer may include a transflective conductive material or a reflective conductive material.

A pixel defined layer 360 is positioned on the second passivation layer 180*b* and the pixel electrode layer. The pixel defined layer 360 may also have a constant thickness and may also have a plurality of different thicknesses depending on a position.

The pixel defined layer 360 may include a first pixel defined layer 360*a* including a plurality of openings through which the pixel electrode 191 is exposed and a second pixel defined layer 360*b* that is positioned in the first peripheral area PA1, in the active area AA. The second pixel defined layer 360*b* may expose the voltage transfer electrode 197 thereunder. Further, the pixel defined layer 360 may further include a third pixel defined layer 360*c* positioned on the voltage transfer line 177 and at least one fourth pixel defined layer 360*d* that is positioned in the second peripheral area PA2. The fourth pixel defined layer 360*d* may include a part positioned on an edge portion of the second passivation layer 180*b* forming the contact hole 186*b* while including the edge side 187*b* and a part positioned on the outside passivation layer 180*bb*.

The third pixel defined layer 360*c* may form a first dam, an edge part of the second passivation layer 180*b* and the fourth pixel defined layer 360*d* thereon, which overlap each other may form a second dam, and the outside passivation layer 180*bb* and the fourth pixel defined layer 360*d* thereon which overlap each other may form a third dam. The third dam may further include a spacer 365 which is positioned on the fourth pixel defined layer 360*d*. The spacer 365 may also include the same material as the pixel defined layer 360 and may also include different materials.

The pixel defined layer 360 may be formed of photosensitive materials such as polyacrylates resin, polyimides resin, or the like.

An emission member 370 is positioned on the pixel defined layer 360 and the pixel electrode 191, in the active area AA. The emission member 370 may include an organic material which uniquely emits light of primary colors such as red, green, and blue.

At least one dummy emission member 370*d* that is positioned on the same layer as the emission member 370 may be positioned on the second pixel defined layer 360*b* which is positioned in the peripheral area PA.

The counter electrode 270 transferring the common voltage ELVSS is positioned on the pixel defined layer 360*a* and the emission member 370. Most of the counter electrode 270 is positioned in the active area AA and extends to the peripheral area PA to be physically and electrically connected to the exposed voltage transfer electrode 197, thereby being applied with the common voltage EVLSS.

The counter electrode 270 may include a transparent conductive material. For example, when the counter electrode 270 includes metal such as calcium (Ca), barium (Ba), magnesium (Mg), aluminum (Al), and silver (Ag), a metal layer may be thinly formed to have optical transmittance.

The pixel electrodes 191, the emission members 370, and the counter electrodes 270 of each pixel PX form a light emitting element and one of the pixel electrode 191 and the counter electrode 270 is a cathode and the other thereof is an anode.

The encapsulating portion 380 is positioned on the counter electrode 270. The encapsulating portion 380 includes a plurality of encapsulating thin film layers 380_1, 380_2, . . . , 380_*n*. The encapsulating thin film layers 380_1, 380_2, . . . , 380_*n* includes at least one inorganic layers 380_2 and 380_*n* and at least one organic layer 380_1, in which the organic layer 380_1 and the inorganic layers 380_2 and 380_*n* may be alternately laminated. The organic layer 380_1 includes the organic material and may have planarization characteristics. The inorganic layers 380_2 and 380_*n* may include inorganic materials such as aluminum oxide (AlOx), silicon oxide (SiOx), and silicon nitride (SiNx).

The inorganic layers 380_2 and 380_*n* that are included in the encapsulating portion 380 covers the organic layer 380_1 positioned therebeneath to prevent the organic layer 380_1 from being exposed to the outside.

The organic layer 380_1 which is included in the encapsulating portion 380 includes an edge which is generally positioned at a boundary between an inner second peripheral area PA21 and an outer second peripheral area PA22 in the second peripheral area PA2. The boundary between the inner second peripheral area PA21 and the outer second peripheral area PA22 may overlap the third pixel defined layer 360*c* which forms the first dam. That is, the edge of the organic layer 380_1 of the encapsulating portion 380 may not generally be formed at an outer side based on the first dam.

The inorganic layers 380_2 and 380_*n* which are included in the encapsulating portion 380 may include all portions which are positioned in the active area AA, the first peripheral area PA1, the inner second peripheral area PA21, and the outer second peripheral area PA22. The edges of the inorganic layers 380_2 and 380_*n* which are included in the encapsulating portion 380 may be spaced apart from each other at a predetermined interval or more from the edge portion dummy pattern CR_e in the outer second peripheral area PA22.

Like several example embodiments of the present invention described above, the pattern layer 400 is formed on the encapsulating portion 380. The pattern layer 400 may include at least one crack preventing portion CR which is positioned in the second peripheral area PA2 and a plurality of patterns that are positioned in the active region AA and/or the first peripheral area PA1. The plurality of patterns which are positioned in the first peripheral area PA1 may configure the touch sensor.

The crack preventing portion CR may include at least one portion having the dam configuration and the crack preventing portion CR may also a plurality of portions which are spaced apart from each other. The crack preventing portion CR may include at least one of the portion positioned on the encapsulating portion 380 including the organic layer 380_1, the portion positioned on the encapsulating portion 380 in which only the inorganic layers 380_2 and 380_*n* are positioned, and the portions which do not overlap the encapsulating portion 380 and are spaced apart from each other in a plane.

In addition, several features and effects of the crack preventing portion CR may be the same as several example embodiments of the present invention described above.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims, and their equivalents.

DESCRIPTION OF SOME OF THE SYMBOLS

110: Lower substrate
140: Gate insulating layer
180a, 180b: Passivation layer
191: Pixel electrode
270: Counter electrode
360: Pixel defined layer
370: Emission member
380: Encapsulating portion
1000: Display panel
CR: Crack preventing portion

What is claimed is:

1. A display device, comprising:
a lower substrate comprising an active area, and a peripheral area outside the active area;
a thin film transistor layer on the lower substrate;
a plurality of pixel electrodes on the thin film transistor layer and in the active area;
an encapsulating portion having a portion on the pixel electrode and
a pattern layer comprising:
touch electrodes disposed in the active area and on the encapsulating portion;
touch wiring disposed in the peripheral area and connected to the touch electrodes; and
a crack preventing portion disposed in the peripheral area and not connected to the touch electrodes,
wherein the crack preventing portion comprises a first part and a second part spaced apart from each other in the peripheral area outside the active area, the first part overlapping and above the encapsulating portion along one edge of the active area, and the second part not overlapping the encapsulation portion along the one edge of the active area,
wherein:
the touch wiring is disposed between the crack preventing portion and the active area in a plan view; and
a minimum distance between an upper surface of the lower substrate and an upper surface of the second part is less than a minimum distance between the upper surface of the lower substrate and an upper surface of the first part.

2. The display device of claim 1, wherein:
the crack preventing portion comprises a plurality of portions spaced apart from each other.

3. The display device of claim 2, wherein:
the pattern layer comprise at least one insulating layer and at least one conductive layer.

4. The display device of claim 3, wherein:
the crack preventing portion comprises at least one of the at least one insulating layers and/or at least one of the at least one conductive layers.

5. The display device of claim 4, wherein:
the touch wiring is at a first peripheral area of the peripheral area that is adjacent to the active area, and
the crack preventing portion is at a second peripheral of the peripheral area outside the first peripheral area.

6. The display device of claim 5, wherein:
the crack preventing portion is spaced apart from the touch wiring.

7. The display device of claim 3, wherein:
the at least one conductive layer comprises the touch electrodes.

8. The display device of claim 7, wherein:
the touch electrodes comprise a first touch electrode on the encapsulating portion and a second touch electrode in a layer different from the first touch electrode.

9. The display device of claim 8, wherein:
the pattern layer comprises a first insulating layer on the first touch electrode and a second insulating layer on the second touch electrode.

10. The display device of claim 2, further comprising:
a buffer layer between the encapsulating portion and the pattern layer.

11. The display device of claim 2, wherein:
the thin film transistor layer comprises at least one insulating layer, and
the at least one insulating layer of the thin film transistor layer comprises an edge dummy pattern at the peripheral area and has at least one dam type.

12. The display device of claim 11, further comprising:
a buffer layer between the encapsulating portion and the pattern layer,
wherein the buffer layer covers the edge dummy pattern.

13. The display device of claim 1 wherein:
the second part of the crack preventing portion is disposed in a same layer as the first part and having a same material as the first part.

14. The display device of claim 1, wherein:
the encapsulating portion comprises at least one inorganic layer and at least one organic layer, which are alternately laminated.

15. The display device of claim 1, wherein:
a light emitting element layer comprising the pixel electrode is between the thin film transistor layer and the encapsulating portion.

* * * * *